(12) United States Patent
Miorini et al.

(10) Patent No.: US 12,237,243 B2
(45) Date of Patent: Feb. 25, 2025

(54) POWER OVERLAY MODULE WITH THERMAL STORAGE

(71) Applicant: GE AVIATION SYSTEMS LLC, Grand Rapids, MI (US)

(72) Inventors: Rinaldo Luigi Miorini, Niskayuna, NY (US); Arun Virupaksha Gowda, Rexford, NY (US); Naveenan Thiagarajan, Clifton Park, NY (US); Brian Magann Rush, Niskayuna, NY (US)

(73) Assignee: GE AVIATION SYSTEMS LLC, Grand Rapids, MI (US)

( * ) Notice: Subject to any disclaimer, the term of this patent is extended or adjusted under 35 U.S.C. 154(b) by 313 days.

(21) Appl. No.: 17/583,495

(22) Filed: Jan. 25, 2022

(65) Prior Publication Data

US 2023/0238301 A1 Jul. 27, 2023

(51) Int. Cl.
*H01L 23/427* (2006.01)
*H01L 23/00* (2006.01)

(52) U.S. Cl.
CPC .......... *H01L 23/4275* (2013.01); *H01L 24/19* (2013.01); *H01L 24/20* (2013.01);
(Continued)

(58) Field of Classification Search
CPC ..... H01L 23/4275; H01L 24/19; H01L 24/20; H01L 24/24; H01L 24/06;
(Continued)

(56) References Cited

U.S. PATENT DOCUMENTS 6,665,187 B1  12/2003  Alcoe et al.
8,937,384 B2   1/2015  Bao et al.
(Continued)

FOREIGN PATENT DOCUMENTS

CN    110010565 A     7/2019
DE   102009022301 A1  11/2010
(Continued)

OTHER PUBLICATIONS

European Patent Office, European Search report re Corresponding Application No. EP 222212921.5, Jun. 20, 2023, 8 pages, Munich, Germany.

*Primary Examiner* — Andres Munoz
*Assistant Examiner* — Neil R Prasad
(74) *Attorney, Agent, or Firm* — McGarry Bair PC

(57) ABSTRACT

A power overlay (POL) module includes a semiconductor device having a body, including a first side and an opposing second side. A first contact pad defined on the semiconductor device first side and a dielectric layer, having a first side and an opposing second side defining a set of first apertures therethrough, is disposed facing the semiconductor device first side. The POL module, includes a metal interconnect layer, having a first side and an opposing second side, the metal interconnect layer second side is disposed on the dielectric layer first side) and extends through the set of first apertures to define a set of vias electrically coupled to the first contact pad. An enclosure defining an interior portion is coupled to the metal interconnect layer first side, and a phase change material (PCM) is disposed in the enclosure interior portion.

19 Claims, 6 Drawing Sheets

(52) U.S. Cl.
CPC .............. *H01L 24/24* (2013.01); *H01L 24/06* (2013.01); *H01L 2224/06181* (2013.01); *H01L 2224/19* (2013.01); *H01L 2224/214* (2013.01); *H01L 2224/221* (2013.01); *H01L 2224/24137* (2013.01)

(58) Field of Classification Search
CPC ....... H01L 2224/06181; H01L 2224/19; H01L 2224/214; H01L 2224/221; H01L 2224/24137
See application file for complete search history.

(56) References Cited

U.S. PATENT DOCUMENTS

| | | |
|---|---|---|
| 8,987,876 B2 | 3/2015 | Gowda et al. |
| 9,918,407 B2 | 3/2018 | Rosales et al. |
| 9,997,494 B2 | 6/2018 | Kim |
| 10,600,714 B2 | 3/2020 | Strader et al. |
| 2008/0164603 A1* | 7/2008 | Sturcken ............... H01L 23/427 257/713 |
| 2017/0077014 A1* | 3/2017 | Gowda ............... H01L 23/4952 |
| 2018/0042139 A1* | 2/2018 | Rosales ............. H05K 7/20436 |
| 2019/0371705 A1* | 12/2019 | Yamauchi ............. H01L 23/473 |
| 2020/0083177 A1* | 3/2020 | Lamorey ............ H01L 25/0655 |

FOREIGN PATENT DOCUMENTS

| | | |
|---|---|---|
| EP | 3154082 B1 | 3/2018 |
| EP | 2779230 B1 | 1/2019 |
| EP | 3716321 A1 | 9/2020 |
| EP | 2779231 B1 | 11/2020 |
| EP | 3735118 A1 | 11/2020 |

* cited by examiner

POWER OVERLAY MODULE WITH THERMAL STORAGE

TECHNICAL FIELD

The disclosure relates generally to structures and methods for packaging power semiconductor devices and, more particularly, to a power overlay module structure that includes an improved thermal interface.

BACKGROUND

The growing demand for power electronic devices to manage high power densities has led to the development of the power electronic module or power module. The power module is an assembly typically including several power components, such as power semiconductor devices, internally interconnected to perform a power conversion function. Power modules are used in power conversion equipment such as industrial motor drives, uninterruptible power supplies, and inverters. Power modules provide the packaging or physical containment for a set of power semiconductor components. The power semiconductors (or "dies") are typically soldered or sintered onto a power electronic substrate that supports the power semiconductors, provides electrical and thermal contact and electrical insulation where needed.

More recently, power modules increasingly employ a power overlay (POL) module type packaging and interconnect system. Such POL modules use multiple layers of conductive and insulative materials to support the power semiconductor devices, provide electrical interconnections between the semiconductor devices and external circuits, and manage heat generated during normal operation.

BRIEF DESCRIPTION OF THE DRAWINGS

A full and enabling disclosure of the present description, including the best mode thereof, directed to one of ordinary skill in the art, is set forth in the specification, which refers to the appended FIGS., in which.

DETAILED DESCRIPTION

Figure 1:
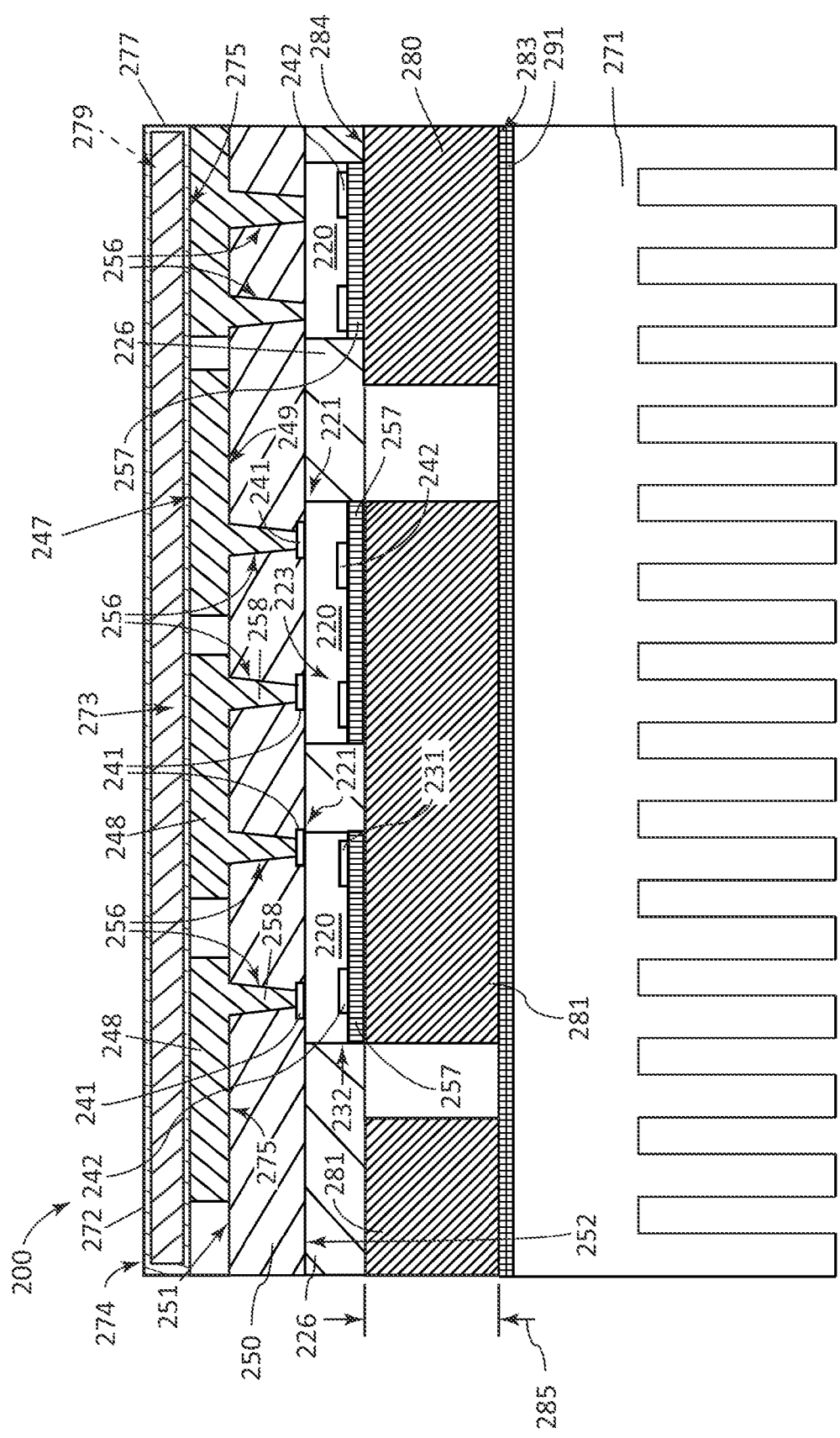
FIG. 1 illustrates a schematic cross-sectional view of a POL module, in accordance with various aspects described herein.

The described aspects of the present disclosure are directed to a POL module that includes thermal storage. Aspects described herein are not limited to any specific electrical power architecture or application, and aspects can be utilized in any desired electrical power system or configuration.

While "a set of" various elements will be described, it will be understood that "a set" can include any number of the respective elements, including only one element. All directional references (e.g., radial, axial, upper, lower, upward, downward, left, right, lateral, front, back, top, bottom, above, below, vertical, horizontal, clockwise, counterclockwise) are only used for identification purposes to aid the reader's understanding of the disclosure, and do not create limitations, particularly as to the position, orientation, or use thereof.

Connection references (e.g., attached, coupled, connected, and joined) are to be construed broadly and can include intermediate members between a collection of elements and relative movement between elements unless otherwise indicated. As such, connection references do not necessarily infer that two elements are directly connected and in fixed relation to each other unless otherwise noted. In non-limiting examples, connections or disconnections can be selectively configured to provide, enable, disable, or the like, an electrical connection between respective elements.

As used herein, the term "insulative coating" in certain non-limiting aspects, can refer to a coating that is both electrically insulative and thermally conductive. Insulative coatings generally exhibit a low electrical conductivity (for example, less than about $10^{-8}$ siemens per meter (S/m)) and a high thermal conductivity (for example, greater than about 100 watt per meter-Kelvin (W/(m K)). However, in other non-limiting aspects, the term "insulative coating" can refer to a coating that is both electrically insulative and thermally insulative.

As used herein, the term "semiconductor device" refers to a semiconductor component, device, die or chip that perform specific functions such as a power transistor, power diode, or analog amplifier, as non-limiting examples. Typical semiconductor devices include input/output (I/O) interconnections, referred to herein as contacts or contact pads, which are used to connect the semiconductor device to external circuitry and are electrically coupled to internal elements within the semiconductor device. The semiconductor devices described herein can be power semiconductor devices used as electrically controllable switches or rectifiers in power electronic circuits, such as switched mode power supplies, for example. Non-limiting examples of semiconductor devices include insulated gate bipolar transistors (IGBTs), metal oxide semiconductor field effect transistors (MOSFETs), bipolar junction transistors (BJTs), integrated gate-commutated thyristors (IGCTs), gate turn-off (GTO) thyristors, Silicon Controlled Rectifiers (SCRs), diodes or other devices or combinations of devices including materials such as Silicon (Si), Silicon Carbide (SiC), Gallium Nitride (GaN), and Gallium Arsenide (GaAs). Semiconductor devices can also be digital logic devices, such as a microprocessor, microcontroller, memory device, video processor, or an Application Specific Integrated Circuit (ASIC), as non-limiting examples.

It should be understood that for ease of description and understanding, the accompanying drawings are not necessarily drawn to scale, and may be depicted schematically. For example, certain elements in the drawings may be larger or smaller than illustrated, relative to other elements depicted in the drawings. While the various aspects of a POL module disclosed below are shown in the Figures and described as including a particular arrangement of a semiconductor device, interconnection wiring and electronic package terminals, it is understood that alternative arrangements and configurations could also be implemented and thus aspects are not limited only to the specifically illustrated devices and arrangements thereof. That is, aspects described herein should also be understood to encompass electronics packages that might include additional electronic components and can additionally or alternatively include one or more alternative device types of semiconductor devices including acoustic devices, microwave devices, millimeter devices, RF communication devices, and micromechanical (MEMS) devices. It is contemplated that aspects of the POL modules as disclosed herein can comprise a semiconductor module or power module providing physical support or containment for one or more semiconductor devices defining a topology. Aspects described herein can also include one or more resistors, capacitors, inductors, filters, switches and similar devices and combinations thereof. As used herein the terms "electrical component" and "electronic component" can be understood to encompass any of the various types of semiconductor devices described above as well as resistors, capacitors, inductors, filters and similar passive devices, and energy storage components.

Conventional semiconductor device modules, power modules and embedded devices employ POL technology to provide numerous advantages in size, performance, and cost.

A conventional POL package manufacturing process typically begins with placement of one or more power semiconductor devices onto a dielectric layer by way of an adhesive. Metal interconnects (e.g., copper interconnects) are then electroplated onto the dielectric layer to form a direct metallic connection to the power semiconductor device(s) by way of vias defined through the dielectric layer, to form a POL sub-module. The metal interconnects provide for the formation of an input/output (I/O) system to and from the power semiconductor device(s). The POL sub-module is then soldered to a insulated metal substrate (for example, a direct bond copper (DBC) substrate) using soldered interconnection for electrical and thermal connectivity. Gaps around the semiconductor between the POL dielectric layer and the ceramic substrate are then filled using a dielectric organic material to form the POL package.

The conventional insulated metal substrates often consist of three layers, i.e., a metal top layer and metal bottom layer with a ceramic insulating layer between. The insulating layer of the insulated metal substrate electrically insulates the metal top layer from the metal bottom layer. The metal layers are either directly bonded or brazed to the ceramic layer. The metal insulated substrate typically can be soldered on an opposite side (e.g., a bottom side) to a baseplate. In many cases, the baseplate is formed of copper and attached to the bottom metal layer of the metal insulated substrate using solder. The baseplate is typically further mounted to a conventional heat sink. The conventional metal insulated substrate is commonly used in POL modules, due to their thermal conductivity and rigidity, to support the semiconductor devices while simultaneously providing an electrical interconnect structure. The rigidity of the baseplate provides additional structural support for the POL module. The insulating layer portion of the metal insulated substrate can also provide electrical isolation between the devices and a heatsink or chassis.

Referring to FIG. 1, a semiconductor device assembly or POL module 200 according to a non-limiting aspect is shown in cross-section. The POL module 200 includes a set of semiconductor devices 220, a dielectric layer 250, a metal interconnect layer 248, a conductive plate 280, a first heat sink 271, an enclosure 272, and a phase change material (PCM) 273 disposed in the enclosure 272. In non-limiting aspects, the enclosure 272 can comprise a set of side walls 277 arranged to define an interior portion or space 279 therebetween. The enclosure 272 can further include a first side 274 (e.g., a top side), and an opposing second side 275 (e.g., a bottom side). In non-limiting aspects, the POL module 200 can include a first thermal interface layer 291 disposed between the conductive plate 280 and the first heat sink 271. The metal interconnect layer 248 can comprise a first side 247 (e.g., a top side) and an opposing second side 249 (e.g., a bottom side). Similarly, the dielectric layer 250 can comprise a first side 251 (e.g., a top side) and an opposing second side 252 (e.g., a bottom side).

The set of semiconductor devices 220 can comprise semiconductor devices 220, each in the respective form of a die, diode, or other power electric device. In non-limiting aspects the set of semiconductor devices 220 can include a first semiconductor device 220, and a second semiconductor device 220. While three semiconductor devices 220 are shown in FIG. 1, it will be appreciated that a greater or lesser number of semiconductor devices 220 can be included in the set of semiconductor devices 220. In addition to the set of semiconductor devices 220, aspects of the POL module 200 can also include any desired number or type of additional circuitry components.

Each semiconductor device 220 can comprise a body 223 having a first side 221 (e.g., a top side) and an opposing second side 232 (e.g., a bottom side). The set of semiconductor devices 220 can comprise so-called "vertically-conducting" type semiconductor devices 220 which allow for electrical I/O interconnections to be made via first contact pads 241 arranged on the first side 221 as well as via one or more second contact pads 242 arranged on the opposing second side 232. The first contact pads 241 and second contact pads 242 operatively couple the semiconductor device 220 to external circuitry (not shown) via the metal interconnect layer 248 and the conductive plate 280, respectively, and can be electrically coupled to internal elements (not shown) within the semiconductor device 220.

The second side 252 of the dielectric layer 250 can be disposed on the first side 221 of the set of semiconductor devices 220. For example, in a non-limiting aspect, an adhesive (not shown) may be used to attach the set of semiconductor devices 220 to the second side of the dielectric layer 250.

In non-limiting aspects, the dielectric layer 250 can comprise a lamination or a film. In some non-limiting aspects, the dielectric layer 250 can be formed of any of a variety of dielectric materials, such as polytetrafluoroethylene (PTFE), polysulfone materials, another polymer film, such as a liquid crystal polymer (LCP) or a polyimide material, or the like. The dielectric layer 250 can also define a set of first apertures 256 therethrough, extending between the dielectric layer first side 251 and second side 252.

The metal interconnect layer 248 can be arranged on the dielectric layer first side. The metal interconnect layer 248 can further extend through the set of first apertures 256 to define a set of vias 258. The metal interconnect 248 can be coupled to the semiconductor devices 220 by way of the set of vias 258. The set of vias 258 enable an electrical connection of the metal interconnect layer 248 with the first contact pads 241 of the semiconductor devices 220 through the dielectric layer 250. It will be appreciated that in aspects employing an optional adhesive to attach the set of semiconductor devices 220 to the dielectric layer second side 252, the set of first apertures 256 will likewise also extend through the adhesive (not shown). The set of first apertures 256 can be arranged to have any desired size and spacing, extending through the dielectric layer 250 or adhesive, or both, to enable an electrical connection from the metal interconnect layer 248 to one or more of the first contact pads 241 of at least one of the semiconductor devices 220. In non-limiting aspects, the metal interconnect layer 248 can comprise copper deposited (e.g., electroplated) onto the first side 251 of the dielectric layer 250 and through the set of first apertures 256 to enable an electrical connection therethrough, that is, from the metal interconnect layer 248 to the first contact pads 241 of the semiconductor devices 220. The metal interconnect layer 248 can have a low profile (e.g., less than 1000 micrometers thick), planar interconnect structure that provides for formation of I/O connections (not shown) to and from the semiconductor devices 220.

In some aspects, spaces or gaps defined between the between the set of semiconductor devices 220 or the post connector, or both, can optionally be filled with a dielectric filler material 226. In various aspects, the dielectric filler material 226 can comprise a polymeric material, such as, for example, an underfill (e.g., capillary underfill or no-flow underfill), encapsulate, silicone, a molding compound, or the like.

The conductive plate 280 includes a first side 281 (e.g., a top side) and an opposing second side 282 (e.g., a bottom side) defining a first thickness 285 therebetween. The conductive plate 280 can be both electrically and thermally conductive across the first thickness 285. For example, in non-limiting aspects, the conductive plate 280 can comprise a material having a high thermal and electrical conductivity, such as copper, aluminum, or a composite conductive material. In various non-limiting aspects, the conductive plate 280 can comprise a monolithic or homogenous structure.

In such aspects, wherein the conductive plate 280 is electrically and thermally conductive across the first thickness 285, the first thermal interface layer 291 can be disposed on the conductive plate second side 282.

In various aspects, the first thermal interface layer 291 can be a thermally conductive, electrically insulating polymeric or organic material coating applied to the conductive plate second side 282. The first thermal interface layer 291 is operative to electrically isolate the conductive plate 280 from the first heat sink 271 and further operative to conduct heat generated by the set of semiconductor devices 220 from the conductive plate 280 to the first heat sink 271.

In non-limiting aspects, the first thermal interface layer 291 can comprise thermally conductive ceramic fillers, particles, or fibers suspended in a polymer matrix (e.g., a resin or epoxy). For example, first thermal interface layer 291 can comprise an epoxy or silicon resin that is filled with thermally conductive, electrically insulating fillers such as alumina, aluminum nitride, beryllium oxide, boron nitride, or a combination thereof. The first thermal interface layer 291 can be electrically insulating and thermally conductive, and can include a polymer matrix impregnated with about 6% to about 60%, by volume, thermally conductive ceramic materials that form continuous thermal pathways within the insulative coating.

In various aspects, the first thermal interface layer 291 can be a thermally conductive, electrically insulating polymeric or organic material coating applied to the conductive plate second side 282. The first thermal interface layer 291 is operative to electrically isolate the first heat sink 271 from the conductive plate 280 and further operative to conduct heat generated by the set of semiconductor devices 220 from the conductive plate 280 to the first heat sink 271. Additionally, in some aspects, the material forming the first thermal interface layer 291 can have adhesive properties operative to bond the first heat sink 271 to the conductive plate 280.

In a non-limiting aspect, the first thermal interface layer 291 can be an insulative coating deposited along at least a portion of the conductive plate second side 282. According to an aspect, the first thermal interface layer 291 can have a thickness of approximately 100 micrometers ($\mu$m). However, in other aspects, the first thermal interface layer 291 can have other thicknesses without departing from the scope of the disclosure herein.

However, in other non-limiting aspects, the conductive plate 280 can alternatively comprise a thermally conductive, electrically insulative structure, such as a metal insulated substrate layer (for example, a direct bond copper (DBC) substrate). Such insulated metal substrates can consist of three layers, i.e., a metal first or top layer and a second or bottom layer with a ceramic insulating layer disposed therebetween. The metal layers can be directly bonded or brazed to the ceramic layer. The ceramic can be alumina, aluminum nitride, silicon nitride, or other ceramic types. The second layer of the metal insulated substrate can be patterned to form a number of conductive contact areas to enable attachment to the semiconductor device second contact pads 242. In other still other non-limiting aspects, a metal insulated substrate can be soldered to a metal baseplate to define the conductive plate 280. It will be appreciated that in such aspects employing a metal insulated substrate layer to form the conductive plate 280, the first thermal interface layer 291 can optionally be an electrically conductive first thermal interface layer 291, because the metal insulated substrate layer can provide the necessary electrical isolation. It will likewise be appreciated that in other non-limiting aspects employing the conductive plate 280 that is electrically insulated from the first heat sink 271 by way of the first thermal interface layer 291, a metal insulated substrate layer can be omitted from the conductive plate 280 without departing from the scope of the disclosure.

Regardless of the type of conductive plate 280 employed, in non-limiting aspects, the set of semiconductor devices 220, can be coupled or bonded, on their respective second sides 232 to the conductive plate first side 281 using an electrically conductive die attachment material 257 such as solder. The conductive plate first side 281 can be patterned or etched therethrough to define a set of conductive contact areas (not shown) prior to attachment or coupling to the set of semiconductor devices 220.

In non-limiting aspects, the first heat sink 271 can be thermally coupled to the POL module 200 to remove or dissipate heat generated by the set of semiconductor devices 220 during operation. In an aspect, the first heat sink 271 can comprise a material having a high thermal conductivity, such as copper, aluminum, or a composite material. The first heat sink 271 can be thermally coupled to the conductive plate 280 by way of the first thermal interface layer 291. For example, in an aspect the first thermal interface layer 291 can be disposed, or sandwiched between the first heat sink 271 and the conductive plate 280. While the first heat sink 271 is depicted for ease of understanding and description, as a conventional passive finned heat sink, aspects are not so limited, and other heat sink arrangements may additionally or alternatively be arranged, including for example, active type heat sinks such as forced-air cooled heat sinks, liquid-cooled heat sinks, or various combinations thereof. In non-limiting aspects, the first heat sink 271 can be coupled or attached to the conductive plate 280 using fasteners such as rivets or screws (not shown).

As will be described in more detail herein, in non-limiting aspects, the enclosure second side 275 can be coupled to the metal interconnect layer first side 247. In non-limiting aspects, the enclosure 272 can be thermally coupled to, but electrically insulated from, the metal interconnect layer 248. In other non-limiting aspects, the enclosure 272 can be thermally and electrically coupled to the metal interconnect layer 248. The enclosure 272 can be configured to house, retain, or otherwise store the PCM 273 disposed therein. As such, the PCM 273 is thermally coupled to the enclosure 272.

The PCM 273 can include, but is not limited to, paraffin wax, a solid which changes phase to a liquid when sufficient energy is absorbed, and further changes phase from a liquid back to a solid when sufficient energy is released. For example, a typical melting point of paraffin wax is between 46 and 68 degrees Celsius. Other PCMs 273, such as organic PCMs 273 can have a melting point in the range of 0 and 100 degrees Celsius. In non-limiting aspects, the PCM 273 can be selected to have any desired melting point range without departing from the scope of the disclosure. After the phase change from solid to liquid, the paraffin wax is able to further absorb supplementary heat, beyond the heat causing the phase change to occur. The paraffin wax is configured to repeatedly change phase from a solid to a liquid, and back to a solid, reliably for multiple cycles. In non-limiting aspects, any desired PCM 273 can be used, including, but not limited to, fatty acids, so long as the material changes phase from a starting phase to at least one different phase in response to the conductive transfer of heat. For example, in non-limiting aspects the PCM 273 can be at a solid-liquid PCM 273 or a solid-solid PCM 273. In other non-limiting aspects, the PCM 273 can be one or more of a shape-stabilized composite paraffin having expanded graphite, a micro-encapsulated composite paraffin and high-density polyethylene compound having expanded graphite, a nano-encapsulated composite paraffin and high-density polyethylene compound having expanded graphite, a micro-encapsulated composite paraffin and high-density polyethylene compound, or a nano-encapsulated composite paraffin and a high density polyethylene compound. The starting phase and at least one different phase can be one of solid, liquid, and gas.

Thus, the phase-change material can reliably store or absorb a first amount of heat from metal interconnect layer 248 and melt from a solid to a liquid. The PCM 273 can further reliably store or absorb a second amount of heat from the metal interconnect layer 248 in liquid form as well. The thermal energy stored or absorbed by the PCM 273 can then be dissipated over a period of time to the external environment. The heat can originate from the semiconductor devices 220 during a temporary or transient time of high-energy or high-heat-producing operations, and the PCM 273 can store the thermal energy.

Figure 2:
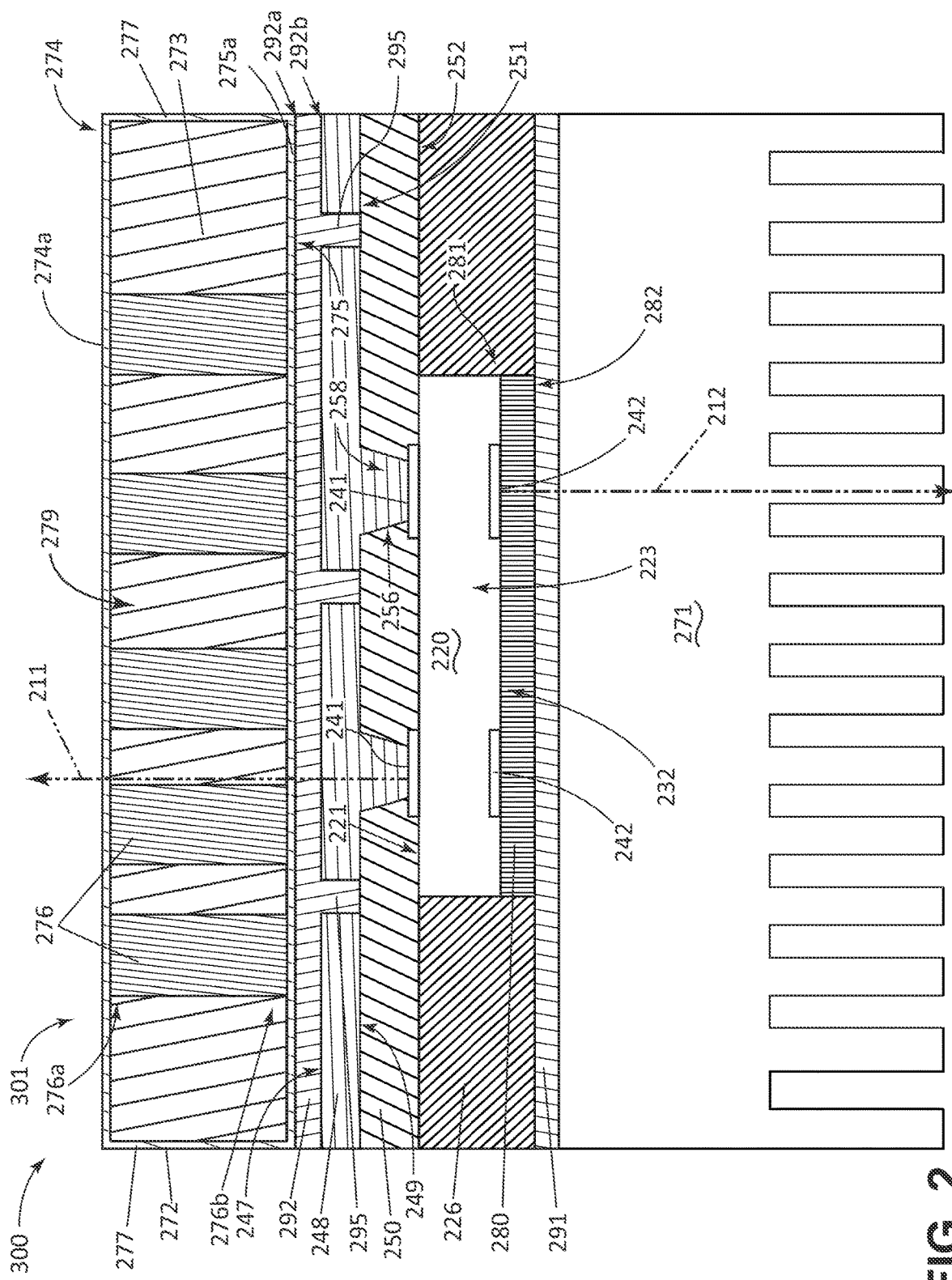
FIG. 2 illustrates a schematic cross-sectional view of another POL module, in accordance with various aspects described herein.

Referring now to FIG. 2, a POL module 300 comprising a POL sub-module 301 is shown in cross-section according to a non-limiting aspect, with some parts omitted for clarity. POL module 300 and POL sub-module 301 include a number of components similar to components shown in POL module 200 and POL sub-module 201 of FIG. 1, and thus numbers used to indicate components in FIG. 1 will also be used to indicate similar components in FIG. 3. The POL sub-module 201 is depicted with the semiconductor device 220, the dielectric layer 250, metal interconnect layer 248, the conductive plate 280, the enclosure 272, and the PCM 273 disposed in the enclosure 272, and the first heat sink 271. As illustrated in FIG. 2, the POL module 200 can include the first thermal interface layer 291 disposed between the conductive plate 280 and the first heat sink 271. Additionally, in non-limiting aspects, the POL module can include a second thermal interface layer second thermal interface layer 292. The second thermal interface layer second thermal interface layer 292 can comprise a first side 292a and an opposing second side 292b. In still other non-limiting aspects, the enclosure 272 can include a set of fins 276 defined therein.

The second thermal interface layer second thermal interface layer 292 can be disposed between, and thermally coupled with, the metal interconnect layer 248 and the enclosure 272. For example, the second thermal interface layer second side 292b can be disposed on the metal interconnect layer first side 247 and thermally coupled with the enclosure 272. In other aspects, the second thermal interface layer first side 292a can be disposed on the enclosure second side 275 and thermally coupled with the metal interconnect layer 248.

In various aspects, the second thermal interface layer 292 can be a thermally conductive, electrically insulating polymeric or organic material coating applied to the metal interconnect layer first side 247. The second thermal interface layer 292 is operative to electrically isolate the enclosure 272 from the metal interconnect layer 248 and further operative to conduct heat generated by the set of semiconductor devices 220 from the metal interconnect layer 248 to the enclosure 272. Additionally, in some aspects, the material forming the second thermal interface layer 292 can have adhesive properties operative to bond the enclosure 272 to the metal interconnect layer 248.

In non-limiting aspects, the second thermal interface layer 292 can include a set of thermal interface layer segments 295 that extend therefrom. For example, in some aspects, the thermal interface layer segments 295 can extend from the thermal interface layer second side 292b through the metal interconnect layer 248. The thermal interface layer segments can further be coupled to the dielectric layer first side 251. As illustrated in FIG. 2., one or more of the thermal interface layer segments 295 can be disposed to electrically insulate one first contact pad 241 from another first contact pad 241. For example, in non-limiting aspects, the thermal interface layer segments 295 can be cooperatively arranged, or sequentially coupled together, to at least partially surround a particular first contact pad 241 to electrically insulate one first contact pad 241 from another first contact pad 241.

In non-limiting aspects, the second thermal interface layer 292 can comprise thermally conductive ceramic fillers, particles, or fibers suspended in a polymer matrix (e.g., a resin or epoxy). For example, second thermal interface layer 292 can comprise an epoxy or silicon resin that is filled with thermally conductive, electrically insulating fillers such as alumina or boron nitride or a combination thereof. The second thermal interface layer 292 can be electrically insulating and thermally conductive, and can include a polymer matrix impregnated with about 6% to about 60%, by volume, thermally conductive ceramic materials that form continuous thermal pathways within the insulative coating.

In a non-limiting aspect, the second thermal interface layer 292 can be an insulative coating deposited along at least a portion of the enclosure second side 275. According to an aspect, the second thermal interface layer 292 can have a thickness of approximately 100 micrometers (μm). However, in other aspects, the second thermal interface layer 292 can have other thicknesses without departing from the scope of the disclosure herein.

The fins 276 can be arranged within the interior space 279 of the enclosure 272 and spaced from each other to increase the total surface area of the enclosure 272. In non-limiting aspects, the fins 276 can be arranged orthogonal to the enclosure second side 275. For example, in non-limiting aspects, the enclosure second side can comprise a base plate 275a, arranged substantially parallel to the metal interconnect layer 248. In such aspects, the fins 276 can be coupled at a first end 276a to the base plate 275a and extend generally orthogonally from the plate baseplate 275a within the interior space 279 towards the enclosure first side 274. In other non-limiting aspects, the enclosure first side 274 can include a cover plate 274a. In such aspects, the fins 276 can be coupled at a second end 276b to the cover plate 274a and extend generally orthogonally from the cover plate 274a within the interior space 279 towards the enclosure second side 275.

Regardless of the orientation of the fins 276 the interior space 279 can be defined between immediately adjacent fins 276 or between the fins 276 and the set of side walls 277, or both. In non-limiting aspects, the PCM 273 can be disposed in one or more of the spaces 279. In this way the PCM 273 can be thermally coupled with the enclosure side walls 277, the fins 276, or both. In this way, a first thermally conductive path (indicated by arrow "211") can be defined extending from the heat generating semiconductor devices 220 through the metal interconnect layer 248, the second thermal interface layer 292, the enclosure baseplate 275a, the fins 276, the PCM 273, and the cover plate 274a. Similarly, a first thermally conductive path (indicated by arrow "212") can be defined extending from the semiconductor devices 220 through the conductive plate 280, the first thermal interface layer 291 and to the heat sink 271.

Figure 3:
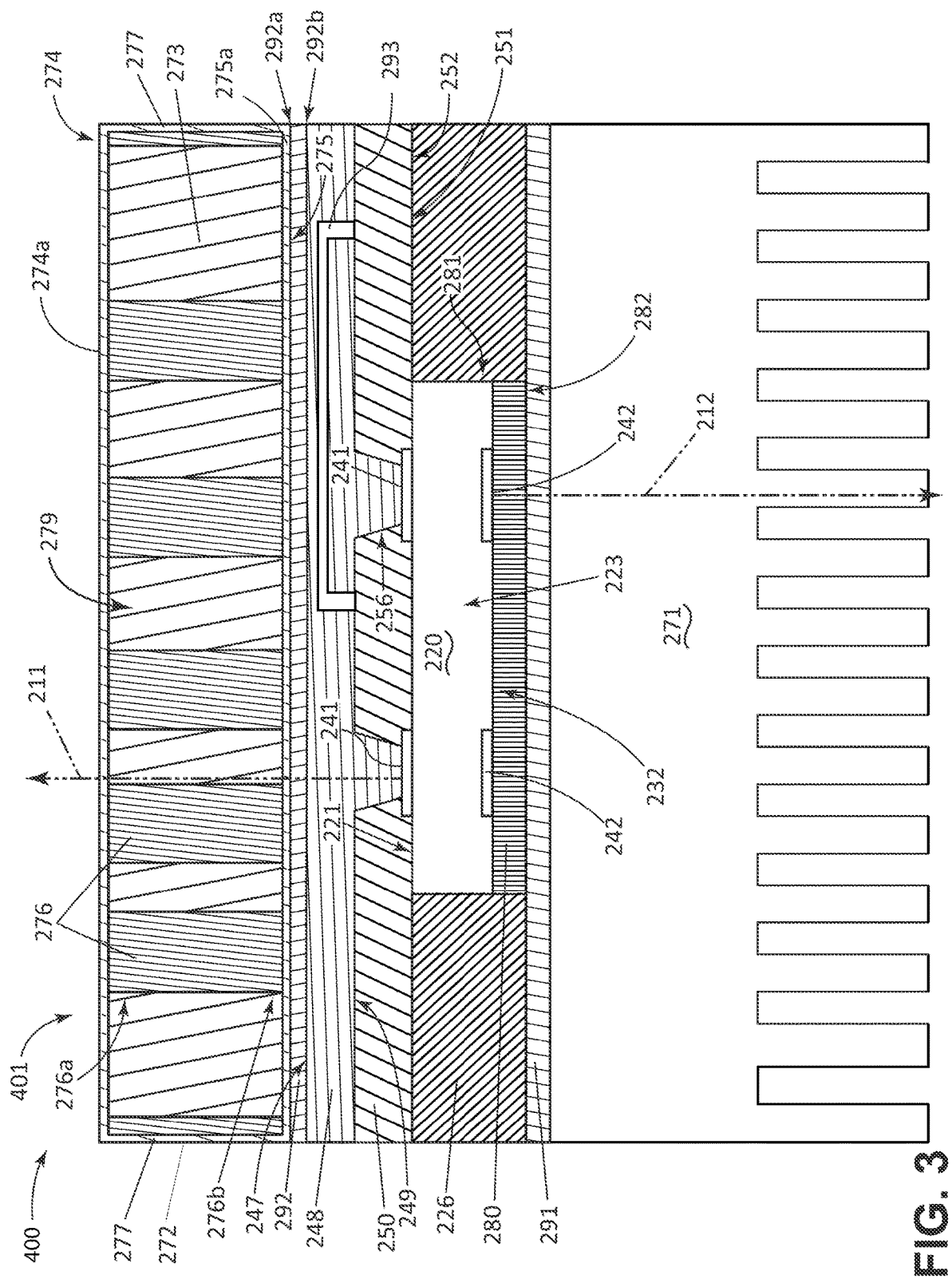
FIG. 3 illustrates a schematic cross-sectional view of another POL module, in accordance with various aspects described herein.

Referring now to FIG. 3, a POL module 400 comprising POL sub-module 401 are shown in cross-section according to a non-limiting aspect. The POL sub-module 401 includes a number of components similar to components shown in POL sub-modules 201, 301 of FIGS. 1 and 2, and thus numbers used to indicate components in FIGS. 1 and 2 will also be used to indicate similar components in FIG. 3. The POL sub-module 401 is depicted with the semiconductor device 220, the dielectric layer 250, the metal interconnect layer 248, the conductive plate 280, the enclosure 272, the PCM 273 disposed in the enclosure 272, and the first heat sink 271. As illustrated in FIG. 3, the POL module 400 can include the first thermal interface layer 291 disposed between the conductive plate 280 and the first heat sink 271.

However, one notable difference is that the non-limiting aspect of FIG. 3 includes a second electrically insulative layer 293. As illustrated, the electrically insulative layer 293 can be disposed within the metal interconnect layer 248 and extend through at least a portion of the metal interconnect layer 248. As illustrated in FIG. 3., electrically insulative layer 293 can be disposed to electrically insulate one first contact pad 241 from another first contact pad 241 of one or more semiconductor devices 220. For example, in non-limiting aspects, the electrically insulative layer 293 can be arranged to at least partially surround a particular first contact pad 241 to electrically insulate the first contact pad 241 from another first contact pad 241.

The electrically insulative layer 293 can further be coupled to the dielectric layer first side 251. In non-limiting aspects, the electrically insulative layer 293 can comprise thermally conductive ceramic fillers, particles, or fibers suspended in a polymer matrix (e.g., a resin or epoxy). For example, electrically insulative layer 293 can comprise an epoxy or silicon resin that is filled with thermally conductive, electrically insulating fillers such as alumina or boron nitride or a combination thereof. The electrically insulative layer 293 can be electrically insulating and thermally conductive, and can include a polymer matrix impregnated with about 6% to about 60%, by volume, thermally conductive ceramic materials that form continuous thermal pathways within the insulative coating. In other non-limiting aspects, the electrically insulative layer 293 can comprise an "unfilled" polymer (e.g., without thermally conductive fillers).

In a non-limiting aspect, the electrically insulative layer 293 can be an insulative coating deposited along at least a portion of the metal interconnect layer 248. According to an aspect, the electrically insulative layer 293 can have a thickness of approximately 100 micrometers ($\mu$m). However, in other aspects, the electrically insulative layer 293 can have other thicknesses without departing from the scope of the disclosure herein.

Figure 4:
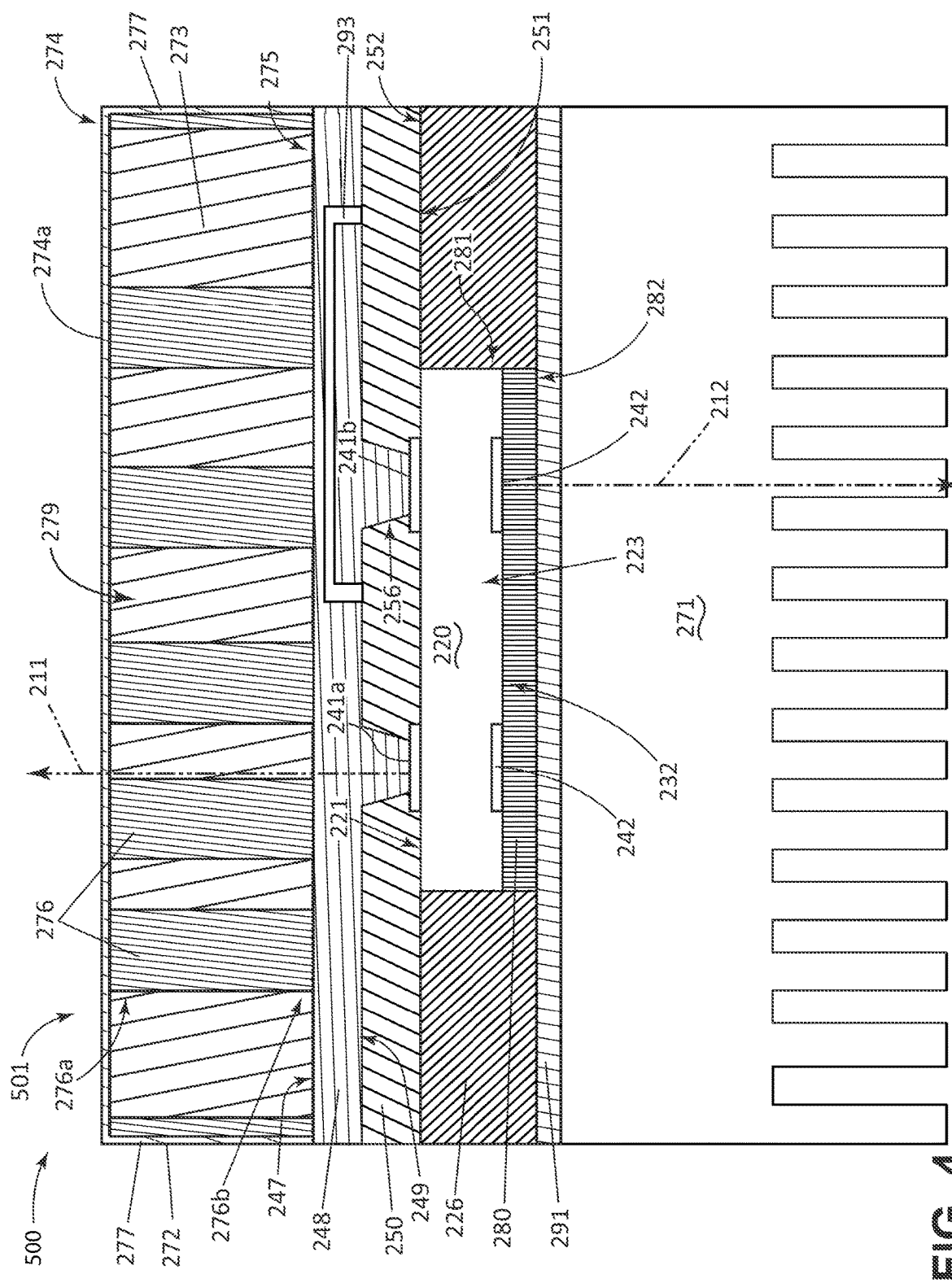
FIG. 4 illustrates a schematic cross-sectional view of another POL module, in accordance with various aspects described herein.

Referring now to FIG. 4, a POL module 500 and POL sub-module 501 are shown in cross-section according to a non-limiting aspect. POL module 500 and POL sub-module 501 include a number of components similar to components shown in POL module 400 and POL sub-modules 401 of FIG.1 3, and thus numbers used to indicate components in FIG. 3 will also be used to indicate similar components in FIG. 4. The POL sub-module 501 is depicted with the semiconductor device 220, the dielectric layer 250, metal interconnect layer 248, the second electrically insulative layer 293, the conductive plate 280, the enclosure 272, the PCM 273 disposed in the enclosure 272, and the first heat sink 271. The semiconductor device 220 is shown with a first contact pad 241 (e.g., a source contact pad) and another first contact pad 241 (e.g., a gate contact pad).

As illustrated in FIG. 4, one notable difference from the aspect depicted in FIG. 3 is that non-limiting aspects can optionally exclude the second thermal interface layer 292 from between the metal interconnect layer 248 and the enclosure 2 and the first heat sink 271. Another notable difference from the aspect depicted in FIG. 3 is that non-limiting aspects can optionally exclude the enclosure baseplate 275a.

As will be appreciated, because the second thermal interface layer 292 is electrically insulating, such aspects that omit the electrically insulating second thermal interface layer 292 would consequently have the enclosure 272 and fins 276 at the same electrical potential as the first contact pad 241 (e.g., the source contact pad) via the metal interconnect layer 248. However, the other first contact pad 241 (e.g., the gate contact pad) would be electrically insulated from the enclosure 272 and fins 276 by the second electrically insulative layer 293. Additionally, the electrically insulative layer 293 would further electrically insulate the two first contact pads 241 (e.g., the source and gate contact pads) from each other.

It will be appreciated that, in non-limiting aspects that exclude the enclosure base plate 275a, the fins 276 or the PCM 273 or both can directly contact the metal interconnect layer 248. The direct contact of the fins 276 and PCM with the metal interconnect layer 248 provides a direct and more efficient thermal coupling to more directly transfer the heat to the enclosure 272.

Additionally, in non-limiting aspects, the fins 276, or enclosure 272, or both can be fabricated or grown directly from the metal interconnect layer 248. For example, in non-limiting aspects, the fins 276, or enclosure 272, or both can be fabricated by additive manufacturing techniques using high thermal conductive materials. In such non-limiting aspects, the fins 276 can be built up layer by layer using conventional methods, such as by micro-dispensing of the fin materials in sequential layers, with laser sintering of each layer. In other non-limiting aspects, the fins 276, or enclosure 272, or both can be fabricated or built up by a combination of electro-plating and etching steps.

Figure 5:
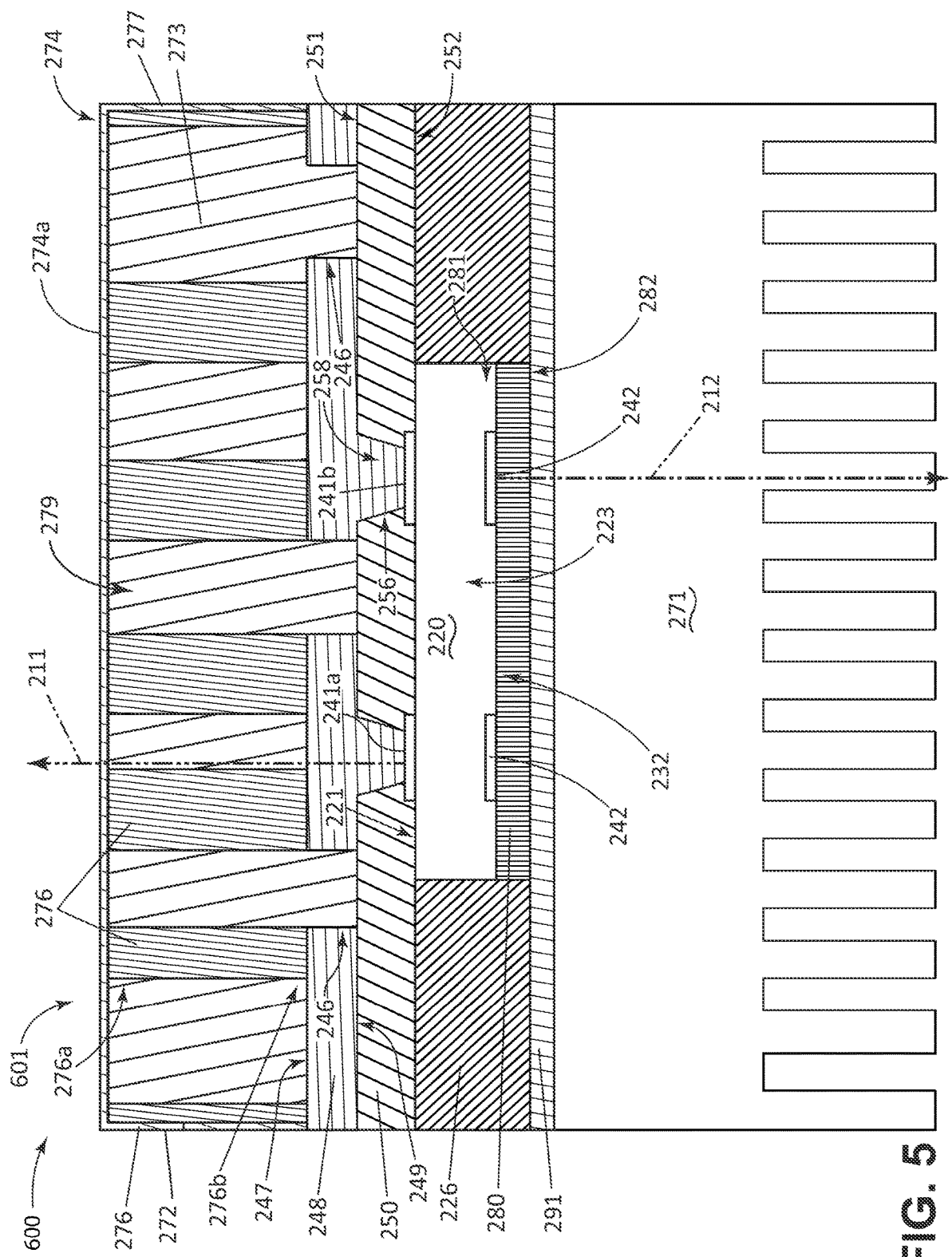
FIG. 5 illustrates a schematic cross-sectional view of another POL module, in accordance with various aspects described herein.

Referring now to FIG. 5, a POL structure 600 and POL sub-module 601 are shown in cross-section according to a non-limiting aspect. POL structure 600 and POL sub-module 601 include a number of components similar to components shown in POL module 300 and POL sub-modules 301 of FIG. 2, and thus numbers used to indicate components in FIG. 2 will also be used to indicate similar components in FIG. 5. The POL sub-module 601 is depicted with the semiconductor device 220, the dielectric layer 250, metal interconnect layer 248, conductive plate 280, enclosure 272, and the PCM 273 disposed in the enclosure 272, and the first heat sink 271. The semiconductor device 220 is shown with a first contact pad 241 (e.g., a source contact pad) and another first contact pad 241 (e.g., a gate contact pad).

As illustrated in FIG. 5, one notable difference from the aspect depicted in FIG. 2 is that the second thermal interface layer 292 can be omitted. In such an aspect, the fins 276 can be arranged in direct physical contact with the metal interconnect layer 248. For example, as noted above, in non-limiting aspects, the fins 276 can be formed integrally with the metal interconnect layer 248, such as via an additive manufacturing process. The fins 276 can be coupled at the first end 276a to the metal interconnect layer 248 and extend generally orthogonally from the metal interconnect layer 248 within the interior space 279 towards the enclosure first side 274. In other non-limiting aspects, the fins 276 can be coupled at the second end 276a to the cover plate 274a and extend generally orthogonally from the cover plate 274a within the interior space 279, and coupled at the first end 276b to the metal interconnect layer 248.

Another notable non-limiting difference from the aspect depicted in FIG. 2 is that the metal interconnect layer 248 can define a set of second apertures 246 defined therethrough. For example, in non-limiting aspects, the set of second apertures 246 can extend from the metal interconnect layer first side 247 to the metal interconnect layer second side 249. In such aspects, the PCM 273 can be further arranged in direct physical contact with the dielectric layer 250 via the set of second apertures 246. In such aspects that exclude the second thermal interface layer 292, the direct physical contact of the PCM 273 with the dielectric layer 250, or the metal interconnect layer 248, or both, can provide improved thermal communication to the PCM 273 along the first thermally conductive path 211 as compared to aspects that include the second thermal interface layer 292. It will be appreciated that in such aspects the PCM 273 can comprise an electrically insulative material to avoid shorting of the first contact pads 241.

Figure 6:
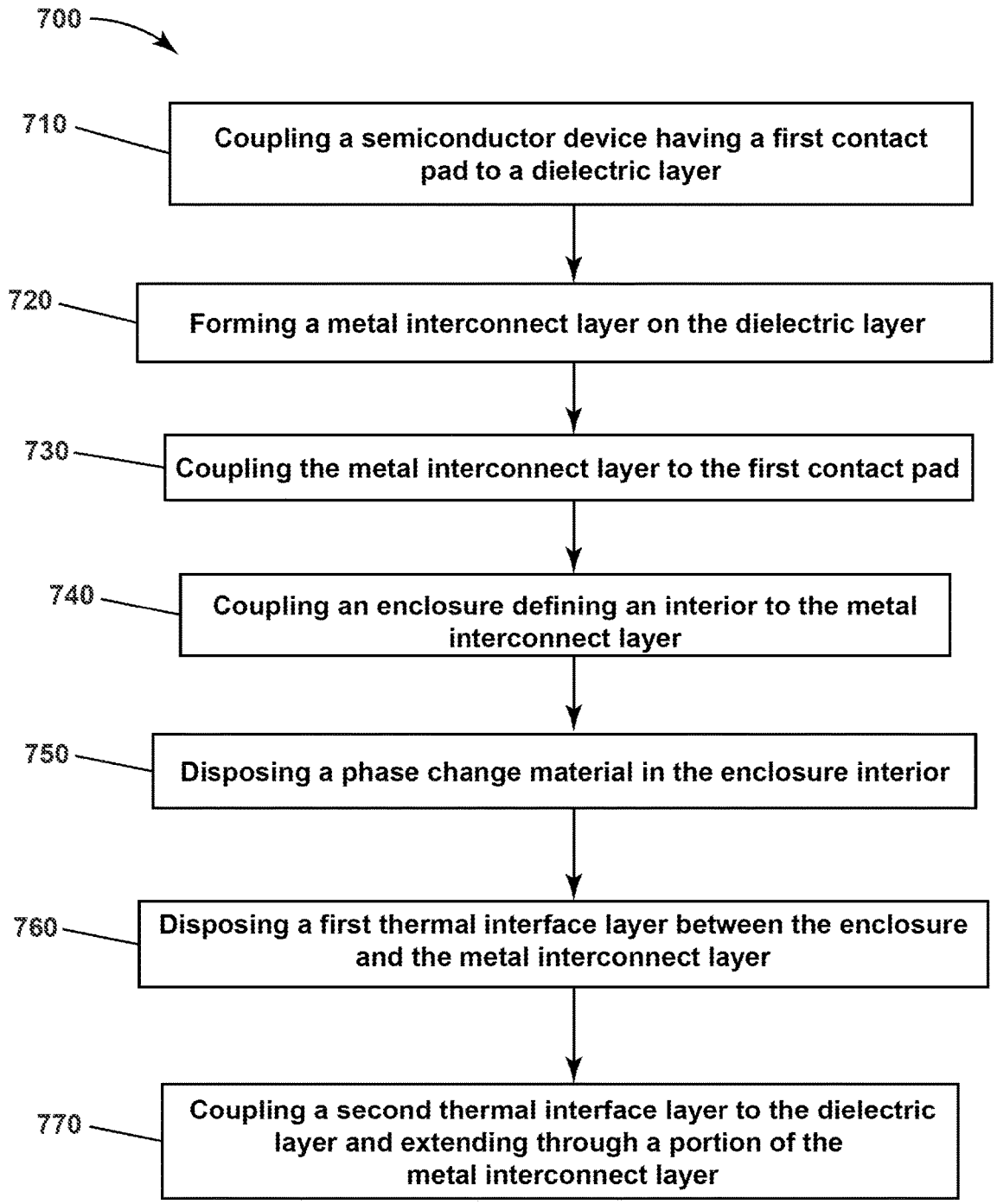
FIG. 6 illustrates a flow diagram of a method of forming a POL module in accordance with various aspects described herein.

FIG. 6 is a method flow diagram illustrating a non-limiting aspect of a method 700 for fabricating the POL module 200-600 according to a non-limiting aspect is shown. The POL module 200-600 can include the semiconductor devices 220 having opposing first and second sides, 221, 232 the dielectric layer 250 having opposing first and second sides 251, 252, the metal interconnect layer 248. The semiconductor device 220 first side can define the first contact pad 241 thereon. In some non-limiting aspects, the POL module 200-600 can include the conductive plate 280, the first thermal interface layer 291 and the first heat sink 271. It will be appreciated that in some aspects, the dielectric layer 250 can comprise first apertures 256 defined therethrough to cooperatively provide with the metal interconnect layer 248 a set of vias 258. In some aspects the formation of the first apertures 256 can be accomplished using conventional techniques prior to, or in conjunction with, the method 700.

The method 700 can begin by coupling the semiconductor device 220 to the dielectric layer 250, at 710. For example, in non-limiting aspects, the coupling can comprise applying an adhesive onto the dielectric layer 250 and mounting the set of semiconductor devices 220 on their respective first sides 232 to the second side 252 of the dielectric layer 250 and curing the adhesive.

The method 700 includes, at 720, forming a metal interconnect layer 248 on the first side 251 of the dielectric layer 250. In non-limiting aspects, the forming of the metal interconnect layer 248 can comprise any desired conventional metallization technique such as sputtering and electroplating. In other non-limiting aspects, other conventional metal deposition techniques can be used to form the metal interconnect layer 248. The metal interconnect layer 248 can also be etched or patterned to define metal interconnects or vertical feed-throughs through the dielectric layer 250. It will be appreciated that in some aspects, forming the conductive metal interconnect layer 248 can include metallizing the first apertures 256 defined through the dielectric layer 250 to define a via 258 therethrough. In other aspects, the metallization of the first apertures 256 can be accomplished using conventional techniques prior to, or in conjunction with, method 700

The method 700 includes, at 730, coupling a first metal interconnect layer 248 to the first contact pad 241 of the semiconductor device 220. It will be appreciated that the coupling the first metal interconnect layer 248 to the first contact pad 241 at 730 can be done at the same time, in conjunction with, or as part of the forming a metal interconnect layer 248 on the first side 251 of the dielectric layer 250 at 720. In other non-limiting aspects, the metal interconnect layer 248 can be soldered to the first contact pad 241 at a via 258.

The method 700 includes, at 740, coupling an enclosure 272 defining the interior space 279 to the metal interconnect layer first side 247, and at 750 disposing a PCM 273 in the interior space 279.

The method 700 can also include at 760, disposing a second thermal interface layer 292 between the enclosure 272 and the metal interconnect layer 248. In non-limiting aspects, the method 700 can also include, at 770, coupling a electrically insulative layer 293 to the dielectric layer first side 251 and extending through a portion of the metal interconnect layer 248 to insulate a first contact pad 241 from a another first contact pad 241 defined on the semiconductor device 220.

In non-limiting aspects, the disposing of the second thermal interface layer 292 can comprise applying an insulative coating to the metal interconnect layer first side 247. In other aspects, the insulative coating can be applied to the enclosure baseplate 275a. In still other aspects, the insulative coating can be applied to both the metal interconnect layer first side 247 and the enclosure baseplate 275a, to define the second thermal interface layer 292.

In an aspect, the material used to form the second thermal interface layer 292 or the second electrically insulative layer 293, or both, can comprise ceramic materials in a polymer resin that is applied by powder coating or other application techniques, such as brushing, or rolling techniques. In other aspects, the material can comprise pure ceramic coatings in a polymer matrix having high thermal conductivity and good dielectric strength and can be applied by chemical vapor deposition ("CVD"), thermal spray, or by electrophoretic deposition ("EPD"). As will be understood, CVD is a conventional deposition process in which a substrate is exposed to one or more volatile precursors, which react or decompose on the substrate surface to produce the desired deposit, and can be done at atmospheric pressure, low pressure, or in a vacuum. As will also be understood, EPD is a conventional electrochemical coating process, in which charged dispersed particles suspended in a liquid medium migrate under the influence of an applied electric field (i.e., electrophoresis), and are deposited onto an electrode (e.g., the metal interconnect layer 248, the enclosure baseplate 275a, or both).

In some non-limiting aspects, the second thermal interface layer 292, or the second electrically insulative layer 293, or both, can be formed using a first material and a second material sequentially applied to a respective one of the metal interconnect layer, and the enclosure baseplate 275a. The two sequentially deposited materials can then be cured at an elevated temperature to infuse the second material into the second material to form a monolithic insulative coating that is both thermally conductive and electrically insulating to define the second thermal interface layer 292, or the second electrically insulative layer 293, or both.

For example, a desired thermal conductivity of the second thermal interface layer 292, or second electrically insulative layer 293, or both can be achieved by incorporating a predetermined amount of thermally conductive ceramic materials, such as aluminum nitride (A1N), boron nitride (BN), aluminum oxide (A1203), or a combination thereof in the first material. The thermally conductive ceramic materials can be uniformly distributed or densely packed to form highly connected thermal conducting paths above a percolation threshold. Additionally, the second material, can be a thermoset polymer resin or an epoxy comprising at least one of liquid crystal polymers, thermal plastics, organic monomers, and oligomers, or a combination thereof arranged in a matrix. In an aspect the second material can be subsequently deposited over the first material. In other non-limiting aspects, the second material can comprise silicone. In still other non-limiting aspects the second material can comprise a thermoset polymer, such as a polyamide-imide. After the first material and the second material are applied, the first material and the second material can be heat treated or cured at an elevated temperature to infuse the second material into the first material.

To the extent not already described, the different features and structures of the various aspects can be used in combination with each other as desired. That one feature is not illustrated in all the aspects is not meant to be construed that it is not included, but is done for brevity of description. Thus, the various features of the different aspects can be mixed and matched as desired to form new aspects of the disclosure, whether the new aspects are expressly described. All combinations or permutations of features described herein are covered by this disclosure.

This written description uses examples to disclose aspects of the disclosure, including the best mode, and to enable any person skilled in the art to practice the aspects of the disclosure, including making and using any devices or systems and performing any incorporated methods. The patentable scope of the disclosure is defined by the claims, and can include other examples that occur to those skilled in the art. Such other examples are intended to be within the scope of the claims if they have structural elements that do not differ from the literal language of the claims, or if they include equivalent structural elements with insubstantial differences from the literal languages of the claims.

Various characteristics, aspects and advantages of the present disclosure can also be embodied in any permutation of aspects of the disclosure, including but not limited to the following technical solutions as defined in the enumerated aspects:

A power overlay (POL) module comprising: a semiconductor device (220) having a body (223), the body (223) including a first side (221) and an opposing second side (232), the semiconductor device (220) including a first contact pad (241) defined on the first side (221); a conductive plate (280) having a first side (281) and an opposing second side (282), the conductive plate first side (281) coupled to the semiconductor device second side (232); a dielectric layer (250), having a first side (251) and an opposing second side (252), defining a set of first apertures (256) therethrough, the dielectric layer second side (252) disposed facing the semiconductor device first side (221); a metal interconnect layer (248), having a first side (247) and an opposing second side (249), the metal interconnect layer second side (249) disposed on the dielectric layer first side (251) and extending through the set of first apertures (256) to define a set of vias (258) electrically coupled to the first contact pad (241); an enclosure (272) defining an interior portion (279), the enclosure (272) coupled to the metal interconnect layer first side (247); and a phase change material (PCM) (273) disposed in the enclosure interior portion (279).

2. The POL module of any preceding clause, wherein the enclosure (272) is directly coupled to the metal interconnect layer first side (247).

3. The POL module of any preceding clause, wherein the PCM (273) is in direct contact with the metal interconnect layer first side (247).

4. The POL module of any preceding clause, wherein the metal interconnect layer (248) further includes a set of second apertures (246) defined therethrough extending from the first side (247) to the opposing second side (249), and wherein the PCM (273) is further disposed in the set of second apertures (246).

5. The POL module of any preceding clause, wherein the PCM (273) is in contact with the dielectric layer first side (251).

6. The POL module of any preceding clause, further comprising a thermal interface layer (292) disposed between the enclosure (272) and the metal interconnect layer first side (247).

7. The POL module of any preceding clause, wherein the enclosure (272) further comprises a set of fins (276) disposed in the interior portion (279) in direct contact with the PCM (273).

8. The POL module of any preceding clause, wherein the enclosure (272) and metal interconnect (248) layer define a unitary structure.

9. The POL module of any preceding clause, further comprising: a second contact pad (242) defined on the semiconductor device second side (232); and a second electrically insulative layer (293) coupled to the dielectric layer first side (251) and extending through a portion of the metal interconnect layer (248), arranged to electrically insulate the first contact pad (241) from another first contact pad (241).

10. The POL module of any preceding clause, further comprising a heat sink (271) thermally coupled to the semiconductor device second side (232).

A method of assembling a POL module comprising: coupling a semiconductor device (220) to a dielectric layer (250), having a first side (251) and an opposing second side (252), defining a set of first apertures (256) therethrough, the semiconductor device (220) having a body (223), including a first side (221) an opposing second side (232), and a first contact pad (241) defined on the semiconductor device first side (221), wherein the dielectric layer second side (252) is disposed facing the semiconductor device first side (221); forming a metal interconnect layer (248) layer having a first side (247) and an opposing second side (249), on the dielectric layer first side (251) and extending through the set of first apertures (256) to define a set of vias (258) electrically coupled to the first contact pad (241); coupling an enclosure (272) defining an interior portion (279) to the metal interconnect layer first side (247); and disposing a PCM (273) in the enclosure interior portion (279).

12. The method of any preceding clause, wherein the enclosure (272) is directly coupled to the metal interconnect layer first side (247).

13. The method of any preceding clause, wherein the PCM (273) is in direct contact with the metal interconnect layer first side (247).

14. The method of any preceding clause, wherein the metal interconnect layer (248) further includes a set of second apertures (246) defined therethrough extending from the metal interconnect layer first side (247) to the opposing second side (249), and wherein the PCM (273) is further disposed in the set of second apertures (246).

15. The method of any preceding clause, wherein the PCM (273) is in contact with the dielectric layer first side (251).

16. The method any preceding clause, further comprising disposing a thermal interface layer (292) between the enclosure (272) and the metal interconnect layer first side (247).

17. The method of any preceding clause, wherein the enclosure (272) further comprises a set of fins (276) disposed in the interior portion (279) in direct contact with the PCM (273).

18. The method of any preceding clause, wherein the enclosure (272) and metal interconnect (248) layer define a unitary structure.

19. The method of any preceding clause, further comprising coupling a second electrically insulative layer (293) to the dielectric layer first side (251) and extending through a portion of the metal interconnect layer (248), to electrically insulate the first contact pad (241) from another first contact pad (241).

20. The method of any preceding clause, further comprising a heat sink (271) thermally coupled to the second side of the semiconductor device second side (232).

What is claimed is:

1. A power overlay (POL) module comprising:
a semiconductor device having a body, the body including a first side and an opposing second side, the semiconductor device including a first contact pad defined on the first side;
a conductive plate having a first side and an opposing second side, the conductive plate first side coupled to the semiconductor device second side;
a dielectric layer, having a first side and an opposing second side, defining a set of first apertures therethrough, the dielectric layer second side disposed facing the semiconductor device first side;
a metal interconnect layer, having a first side and an opposing second side, the metal interconnect layer second side disposed on the dielectric layer first side and extending through the set of first apertures to define a set of vias electrically coupled to the first contact pad;
an enclosure having a set of walls cooperatively defining an interior portion, and a set of fins disposed in the interior portion, the enclosure coupled to the metal interconnect layer first side; and
a phase change material (PCM) disposed in the enclosure interior portion in direct contact ith the set of fins, wherein at least one wall of the enclosure is disposed between the PCM and the metal interconnect layer first side.

2. The POL module of claim 1, wherein the enclosure is directly coupled to the metal interconnect layer first side.

3. The POL module of claim 2, wherein the metal interconnect layer further includes a set of second apertures defined therethrough extending from the first side to the opposing second side, and wherein the PCM is further disposed in the set of second apertures.

4. The POL module of claim 2, wherein the PCM is in contact with the dielectric layer first side.

5. The POL module of claim 1, further comprising a thermal interface layer disposed between the enclosure and the metal interconnect layer first side.

6. The POL module of claim 2, wherein the enclosure and metal interconnect layer define a unitary structure.

7. The POL module of claim 1, further comprising:
a second contact pad defined on the semiconductor device second side; and
a second electrically insulative layer coupled to the dielectric layer first side and extending through a portion of the metal interconnect layer, arranged to electrically insulate the first contact pad from another first contact pad.

8. The POL module of claim 1, further comprising a heat sink thermally coupled to the semiconductor device second side.

9. A method of assembling a POL module comprising:
coupling a semiconductor device to a dielectric layer having a first side and an opposing second side, the dielectric layer defining a set of first apertures therethrough, the semiconductor device having a body, including a first side an opposing second side, and a first contact pad defined on the semiconductor device first side, wherein the dielectric layer second side is disposed facing the semiconductor device first side;
forming a metal interconnect layer having a first side and an opposing second side, on the dielectric layer first side and extending through the set of first apertures to define a set of vias electrically coupled to the first contact pad;
coupling an enclosure having a set of walls cooperatively defining an interior portion including a set of fins defined therein to the metal interconnect layer first side; and
disposing a PCM in the enclosure interior portion in contact with the set of fins wherein at least one wall of the enclosure is disposed between the PCM and the metal interconnect layer first side.

10. The method of claim 9, wherein the enclosure is directly coupled to the metal interconnect layer first side.

11. The method of claim 10, wherein the metal interconnect layer further includes a set of second apertures defined therethrough extending from the metal interconnect layer first side to the opposing second side, and wherein the PCM is further disposed in the set of second apertures.

12. The method of claim 10, wherein the PCM is in contact with the dielectric layer first side.

13. The method of claim 9, further comprising disposing a thermal interface layer between the enclosure and the metal interconnect layer first side.

14. The method of claim 10, wherein the enclosure and metal interconnect layer define a unitary structure.

15. The method of claim 9, further comprising coupling a second electrically insulative layer to the dielectric layer first side and extending through a portion of the metal interconnect layer, to electrically insulate the first contact pad from another first contact pad.

16. The method of claim 10, further comprising a heat sink thermally coupled to the second side of the semiconductor device second side.

17. The POL module of claim 1, wherein the fins are spaced from each other to increase a total surface area of the enclosure.

18. The POL module of claim 1, wherein the enclosure includes a first side and an opposing second side, the first side including a baseplate arranged parallel to the metal interconnect layer, wherein the fins are coupled to the baseplate and extend from the baseplate within the interior portion toward second side.

19. The POL module of claim 1, wherein the enclosure includes a first side and an opposing second side, the second side including a top plate, wherein the fins are coupled to the top plate and extend from the top plate within the interior portion toward the metal interconnect layer.

* * * * *